United States Patent [19]

Ngan

[11] Patent Number: 5,707,498
[45] Date of Patent: Jan. 13, 1998

[54] AVOIDING CONTAMINATION FROM INDUCTION COIL IN IONIZED SPUTTERING

[75] Inventor: Kenny King-Tai Ngan, Fremont, Calif.

[73] Assignee: Applied Materials, Inc., Santa Clara, Calif.

[21] Appl. No.: 682,845

[22] Filed: Jul. 12, 1996

[51] Int. Cl.$^6$ .................................................. C23C 14/34
[52] U.S. Cl. ........................... 204/192.12; 204/192.13; 204/298.03; 204/298.06; 204/298.08; 204/298.11
[58] Field of Search ........................ 204/192.12, 192.13, 204/298.03, 298.06, 298.08, 298.16, 298.15, 298.07, 298.11; 118/723 AN, 723 I, 723 IR

[56] References Cited

U.S. PATENT DOCUMENTS

| | | | |
|---|---|---|---|
| 3,594,295 | 7/1971 | Meckel et al. | 204/192.12 |
| 3,595,773 | 7/1971 | Wurm et al. | 204/192.12 |
| 4,999,096 | 3/1991 | Nihei et al. | 204/192.3 |
| 5,178,739 | 1/1993 | Barnes et al. | 204/192.12 |
| 5,232,571 | 8/1993 | Braymen | 204/192.22 |
| 5,380,414 | 1/1995 | Tepman | 204/298.11 |
| 5,382,339 | 1/1995 | Aranovich | 204/298.11 |
| 5,431,799 | 7/1995 | Mosely et al. | 204/298.06 |
| 5,460,707 | 10/1995 | Wellerdieck | 204/298.06 |

OTHER PUBLICATIONS

S.M. Rossnagel et al, "Metal Ion Deposition from Ionized Magnetron Sputtering Discharge", J. Vac. Sci. Technol. B, vol. 12, No. 1, Jan./Feb. 1994, pp. 449–453.

Primary Examiner—R. Bruce Breneman
Assistant Examiner—Rodney G. McDonald
Attorney, Agent, or Firm—Robert J. Stern

[57] ABSTRACT

A method of deposited a film on a semiconductor workpiece in an inductively-coupled plasma sputtering chamber so as to avoid contamination of the film by material sputtered off the induction coil. This is accomplished by alternately performing two processes in the chamber: (1) a pasting process performed with no RF power applied to the induction coil, and (2) an inductively-coupled plasma sputter deposition process for depositing a desired film on a semiconductor workpiece. The pasting process deposits material from the target onto the surface of the induction coil, thereby forming a protective coating on the coil. To the extent the coating material is sputtered off the induction coil during the subsequent ionized sputtering process, it will be the same as the material being sputtered off the target, and therefore it will not contaminate the film being deposited on the semiconductor workpiece. After a certain number of semiconductor workpieces are processed with the ionized sputtering process, the protective coating on the induction coil will thin enough in spots to risk exposing the underlying material of the coil. At that point, the film deposition process is terminated, and the pasting process is repeated. After the pasting process deposits a coating on the coil, the film deposition process can resume.

13 Claims, 2 Drawing Sheets 5,707,498

AVOIDING CONTAMINATION FROM INDUCTION COIL IN IONIZED SPUTTERING

FIELD OF THE INVENTION

The invention relates generally to ionized sputtering processes for fabricating semiconductors. More specifically, the invention relates to avoiding contamination of the semiconductor workpiece by material inadvertently sputtered from an RF induction coil in an ionized sputtering chamber.

BACKGROUND OF THE INVENTION

Sputter deposition is a process commonly used to deposit films, typically of conductive material, on semiconductor workpieces during the fabrication of semiconductor devices. In sputter deposition, the semiconductor workpiece and a target are mounted within a vacuum chamber. A sputtering gas such as argon is flowed into the chamber while a DC power supply applies a negative voltage to the target relative to the electrically grounded metal walls of the chamber. The negative target voltage excites the argon gas near the target into a plasma state and accelerates argon ions from the plasma to bombard the target. The bombardment of the target causes an emission (i.e., sputtering) of atoms from the target surface. The sputtered target atoms leave the target with a distribution of angular trajectories so that the sputtered atoms deposit to varying degrees on all exposed surfaces in the chamber. The semiconductor workpiece is mounted close to, and parallel to, the target so that high proportion of the sputtered target atoms deposit on the workpiece.

In a non-ionized sputtering process, the plasma occupies a relatively small region near the target, and only a very small proportion of sputtered target atoms are ionized in the plasma. Because almost all of the sputtered atoms are neutral, any DC voltage applied to the semiconductor workpiece would have little effect on the angular trajectories of the sputtered atoms, so the workpiece typically is left electrically floating. The resulting wide angular distribution of sputtered atom trajectories is undesirable in processes for filling cavities (called vias, plugs, or trenches) having high aspect ratios, i.e., a high ratio of depth to width.

Ionized sputtering processes are the same as just described, but additionally employ an RF power source to excite a relatively high density plasma in a region between the target and the semiconductor workpiece. The RF-excited plasma ionizes a high proportion of the atoms sputtered off the target. A second DC power supply applies a negative voltage to the semiconductor workpiece relative to the electrically grounded metal walls of the chamber. The negative voltage on the workpiece relative to the plasma accelerates the ionized sputtered target atoms so that they impact the workpiece with more perpendicular trajectories than in non-ionized sputtering, which greatly enhances the filling of high aspect ratio cavities on the workpiece.

One conventional method of providing RF power to excite a plasma for ionized sputtering is to provide an induction coil inside the vacuum chamber, and to connect the coil to an RF power supply. This is called inductively coupled ionized sputtering. (See S. M. Rossnagel et al, "Metal Ion Deposition from Ionized Magnetron Sputtering Discharge", J. Vac. Sci. Technol. B, vol. 12, no. 1, Jan/Feb 1994, pp. 449–453.)

One problem with inductively coupled ionized sputtering is that the induction coil itself is sputtered. Specifically, the RF power applied to the induction coil produces large instantaneous voltage differentials along the coil. When the instantaneous voltage at a particular point on the coil is negative, that point will be bombarded by ions of the sputtering gas, causing material to be sputtered off the surface of the coil. Some of this material can deposit on the semiconductor workpiece and thereby contaminate the film intended to be deposited on the workpiece.

One proposed solution to this contamination problem is to fabricate the induction coil out of, or coat it with, the material being deposited (as proposed in U.S. Pat. No. 5,178,739 issued Jan. 12, 1993 to Barnes et al.). However, fabricating the induction coil entirely out of the material being deposited is impractical for at least certain important materials. For example, in an aluminum deposition process, it would be impractical to fabricate an aluminum induction coil because aluminum would soften and deform at the temperatures typically experienced by the inductiion coil. Even if the material being deposited is a refractory metal, such as titanium, contamination of the deposited film will be avoided only if the induction coil material has an impurity concentration comparable to that of the sputtering target, which typically is 99.999% pure. An induction coil fabricated of 99.999% titanium would cost ten times more an induction coil fabricated of 99.97% pure, commercial grade titanium. Therefore, fabricating the induction coil entirely out of the material being deposited typically is impractical.

Coating the induction coil with the material being deposited would be expected to solve the contamination problem if it were possible to coat the coil with sufficiently high purity material. However, the Barnes et al. prior art merely proposes such a coating without disclosing any method of creating the coating.

An additional disadvantage of both these solutions is that they do not accommodate using the same chamber to deposit different materials. In non-ionized sputtering chambers, it is conventional to simply install a target composed of a different material in order to configure the chamber to deposit that material. If the induction coil were required to also be composed of, or coated with, the same material, then reconfiguring the chamber would required replacing the induction coil, which conventionally is not easily accomplished.

SUMMARY OF THE INVENTION

The invention is a method of deposited a film on a semiconductor workpiece in an inductively-coupled plasma sputtering chamber so as to avoid contamination of the film by material sputtered off the induction coil. This is accomplished by alternately performing two processes in the chamber: (1) a pasting process performed with no RF power applied to the induction coil, and (2) an inductively-coupled plasma sputter deposition process for depositing a desired film on a semiconductor workpiece.

The pasting process deposits material from the target onto the surface of the induction coil, thereby forming a protective coating on the coil. To the extent the coating material is sputtered off the induction coil during the subsequent ionized sputtering process, it will be the same as the material being sputtered off the target, and therefore it will not contaminate the film being deposited on the semiconductor workpiece.

Specifically, in the pasting process the target material is deposited on the surface of the induction coil by operating the sputtering chamber for a period of time with no RF power applied to the coil, but with a flow of sputtering gas and with electrical power applied to the target. Under this operating condition the target will be sputtered as in a non-inductively coupled plasma sputtering process, and material sputtered from the target will deposit on exposed surfaces of the chamber facing the target, including exposed surfaces of the induction coil.

After the film deposition process has continued for a certain time period (e.g., after a certain number of semiconductor wafers have been processed), portions of the protective coating on the induction coil may be sufficiently eroded by sputtering to risk exposing the underlying material of the coil. At that point, the film deposition process preferably is terminated, and the pasting process is repeated. After the pasting process deposits a coating on the coil, the film deposition process can resume.

One advantage of the invention is that it is readily adapted to configuring a single ionized sputtering chamber to deposit different types of film materials on the workpiece. For example, to convert a chamber from depositing aluminum to depositing titanium, the aluminum sputtering target simply can be replaced with a titanium target. The pasting process then should be performed to deposit a titanium coating on the induction coil, thereby covering up any previously deposited aluminum coating on the coil. After the titanium coating is deposited, the chamber is ready to deposit titanium on semiconductor workpieces using ionized sputtering.

DETAILED DESCRIPTION OF THE PREFERRED EMBODIMENTS

1. Sputtering Chamber

Figure 1:
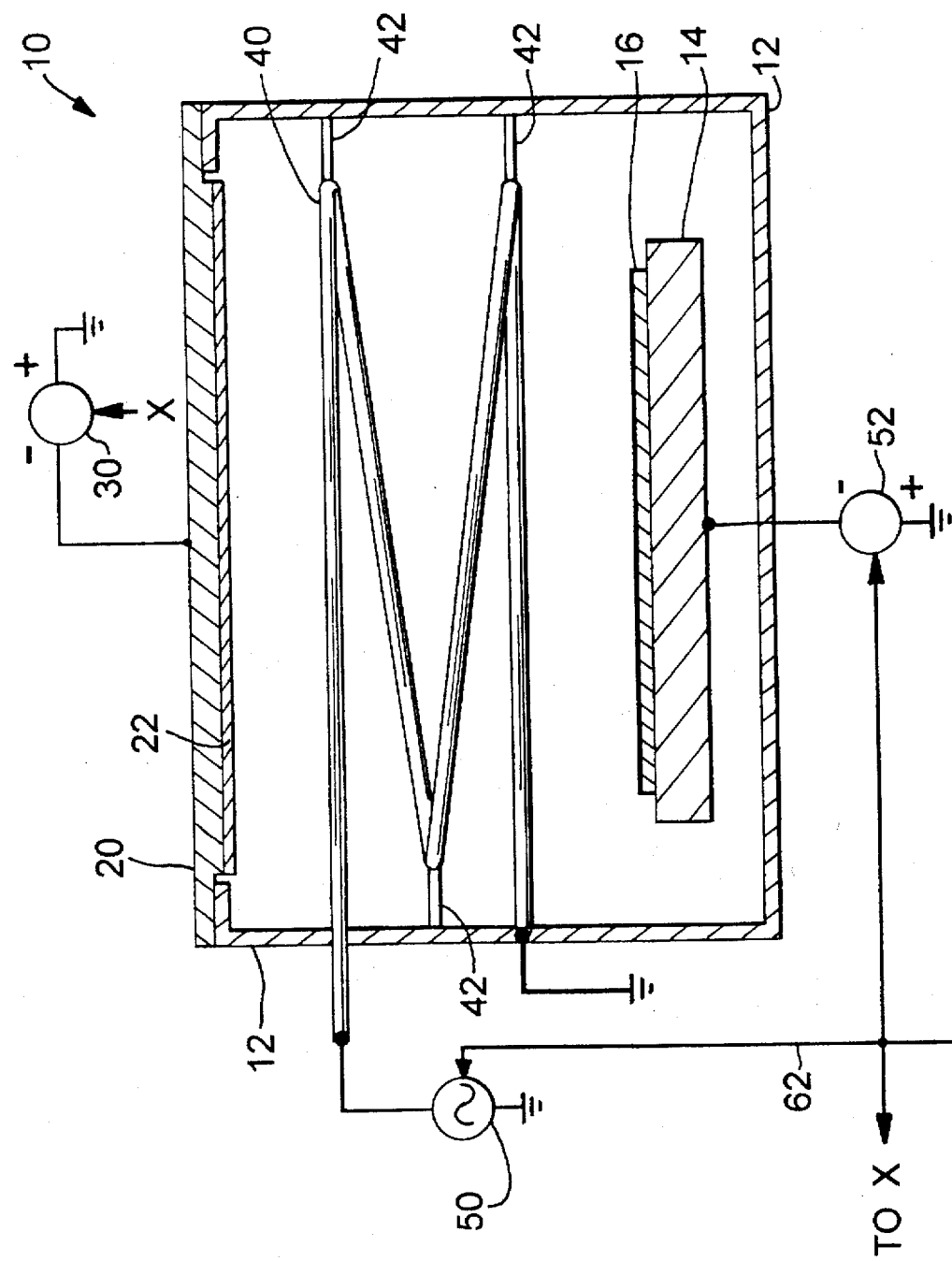
FIG. 1 is a schematic sectional view of an ionized sputtering chamber suitable for performing the process of the present invention.

FIG. 1 shows an ionized sputtering chamber 10 suitable for fabricating semiconductor wafers using the process of the present invention. The cylindrical chamber body 12 typically is aluminum and is electrically grounded. A disc-shaped wafer support chuck 14 has a flat upper surface on which a robot (not shown) places a semiconductor wafer 16 to be processed within the chamber. The wafer typically is secured on the chuck by either a clamp ring or an electrostatic chuck (not shown).

A magnetron target assembly 20 is mounted on the top of the chamber body 12. The target assembly includes a disc-shaped target 22 attached to a rigid backing plate. Magnets immediately behind the backing plate create a magnetic field which enhances plasma density near the exposed lower surface of the target 22.

A sputtering gas such as argon flows into the chamber at a controlled flow rate, typically on the order of 50 sccm, through a gas inlet port (not shown). A vacuum pump exhausts gas from the chamber through an exhaust port (not shown) and regulates the total chamber pressure at a desired level, typically on the order of 0.1 to 50 milliTorr. A target power supply 30 supplies a negative DC voltage to the target 22 relative to ground. During sputter deposition, the target power supply typically delivers about −500 volts to the target at a power level on the order of 5,000 watts.

The chamber components just described are conventional in either a non-ionized sputtering chamber or an ionized sputtering chamber. Our preferred inductively-coupled plasma chamber for ionized sputtering additionally includes a circular induction coil 40 which encircles a region in the chamber between the wafer 16 and the target 22. The induction coil is mounted to the cylindrical side wall of the chamber body 12 by dielectric spacers or stand-offs 42 which electrically insulate the coil from the electrically grounded chamber body.

In the presently preferred embodiment, the induction coil 40 has three turns, but a single-turn coil or a coil with a different number of turns also can be used. The coil in this embodiment is fabricated of titanium, with stainless steel fittings to connect the coil to a cable connected to the RF power supply 50. An all stainless steel coil also should be suitable, as should a coil made from any good electrical conductor that can withstand the temperatures to which the coil will be exposed, typically a few hundred degrees Celsius. The coil preferably is tubular so that water can be pumped through the coil for cooling purposes. The surface of the coil preferably is roughened by a process such as conventional bead blasting to improve adhestion of material deposited on the coil in the pasting process described below.

The dielectric spacers 42 are much narrower in the axial direction than the coil, so that the coil shields the spacers from exposure to material sputtered from the target 22. This is important to prevent sputtered material from short-circuiting the coil to the chamber body.

An induction coil power supply 50 applies RF power to the induction coil. In the preferred embodiment, the induction coil power supply produces a frequency of 2 MHz at a power level on the order of 1,500 watts. Other RF frequencies conventionally used for inductively coupled plasmas, including the commonly used frequency of 13.54 MHz, also should be suitable. A bias power supply 52 applies a negative DC voltage to the wafer chuck 14, typically at a voltage of zero to −200 volts.

A conventional controller circuit 60 connects to each of the three power supplies 30, 50, and 52, preferably via a shared digital bus 62. The controller circuit preferably is a conventional programmable digital microcomputer or microcontroller integrated circuit. The controller circuit is programmed to perform each of the process steps described below by turning the power supplies off and on, and, preferably, by controlling the output voltage or power level of each power supply.

2. Ionized Sputter Deposition Process

The described sputtering chamber 10 operates as follows when performing an ionized sputtering process to deposit a film on a semiconductor wafer. With the argon sputtering gas flowing into the chamber and the vacuum pump maintaining a chamber pressure on the order of 30 mT, the target power supply 30 excites the sputtering gas into a plasma state in the region just below the target 22. The negative target voltage accelerates argon ions to bombard the target, which causes emission (i.e., sputtering) of target atoms from the target. Each sputtered target atom initially travels in a straight trajectory from the target, but the trajectories of the sputtered atoms are distributed over a broad range of angles.

Most of the sputtered atoms of target material will enter the region encircled by the induction coil 40. The RF power applied to the induction coil excites the mixture of sputtering gas and sputtered target atoms into a high density plasma state. If the RF power is sufficient, and if the chamber pressure is within an optimum range, most of the sputtered target atoms will be ionized within this high density plasma. (The well known conditions for maximizing ionization of sputtered atoms are described in Rossnagel et al., supra, the entire content of which hereby is incorporated by reference into this patent specification.) The ions of target material then are accelerated by the negative bias voltage on the wafer 16 so that their trajectories are nearly perpendicular to the wafer when the target material ions impact the wafer. Consequently, the target material can fill higher aspect ratio vias or trenches on the wafer than would be possible with non-ionized sputtering.

As stated above in the "Background of the Invention", an undesirable effect of ionized sputtering is that the induction coil 40 is sputtered to some extent. The RF power applied to the induction coil produces large instantaneous voltage differentials along the coil, typically on the order of 200 to 300 volts rms. When the instantaneous voltage at a particular point on the coil is negative relative to the plasma potential, that point will be bombarded by ions of the sputtering gas and by ions of target material, causing material to be sputtered off the surface of the coil. This sputtering takes place to some extent on all surfaces of the coil which face the plasma, i.e., all coil surfaces facing the central axis of the chamber.

Some of the sputtered coil material will deposit on the semiconductor wafer 16. The wafer will be contaminated if the sputtered coil material is different from the material being deposited on the wafer. As explained above in the "Background of the Invention", for certain materials such as aluminum, it is impractical to make the induction coil of the same material as the film being deposited. For other materials, such as titanium, even if the coil is fabricated of the same type of material as the sputtering target, it often is impractical to manufacture a coil of material having an impurity concentration low enough to avoid contaminating the deposited film, i.e., an impurity concentration comparable to that required for the sputtering target. Therefore, without the pasting process described below, sputtering of the coil will contaminate the deposited film.

3. Pasting Process

In the present invention, a pasting process is performed before any semiconductor wafers are processed. The pasting process deposits on the surfaces of the coil a coating of target material, thereby ensuring that any material sputtered from the coil during wafer processing is identical to the high-purity material being deposited on the wafer.

During the pasting process, no production semiconductor wafer is inside the chamber. Instead, a dummy wafer or some other cover or shutter is positioned over the top surface of the wafer chuck to protect the chuck 14 from sputtered material. This may be accomplished by simply loading a dummy wafer in the chamber in the same manner as a production wafer.

For the pasting process, the sputtering process is performed as described above for ionized sputtering, except that the induction coil RF power supply 50 is turned off. Specifically, the target power supply 30 remains on, and the sputtering gas flow rate and chamber pressure remain roughly similar to that described above. Consequently, the sputtering gas will sputter the target as in a conventional non-ionized sputtering chamber.

Sputtered target atoms will deposit on all exposed surfaces within the chamber that face the target, including all surfaces of the induction coil that face the target. Without any voltage applied to the coil, there will be no appreciable sputtering of the coil to offset the deposition of target material on the coil. Therefore, the pasting process deposits a coating of target material on the coil.

Without the high density plasma created by the induction coil, only an insignificant portion of the sputtered target atoms will be ionized. Therefore, any bias voltage applied to the wafer will have negligible effect on the trajectories of the sputtered target atoms. Preferably, the wafer bias power supply 52 is turned off during the pasting process.

4. Alternating Pasting Process and Ionized Sputter Deposition Process

Figure 2:
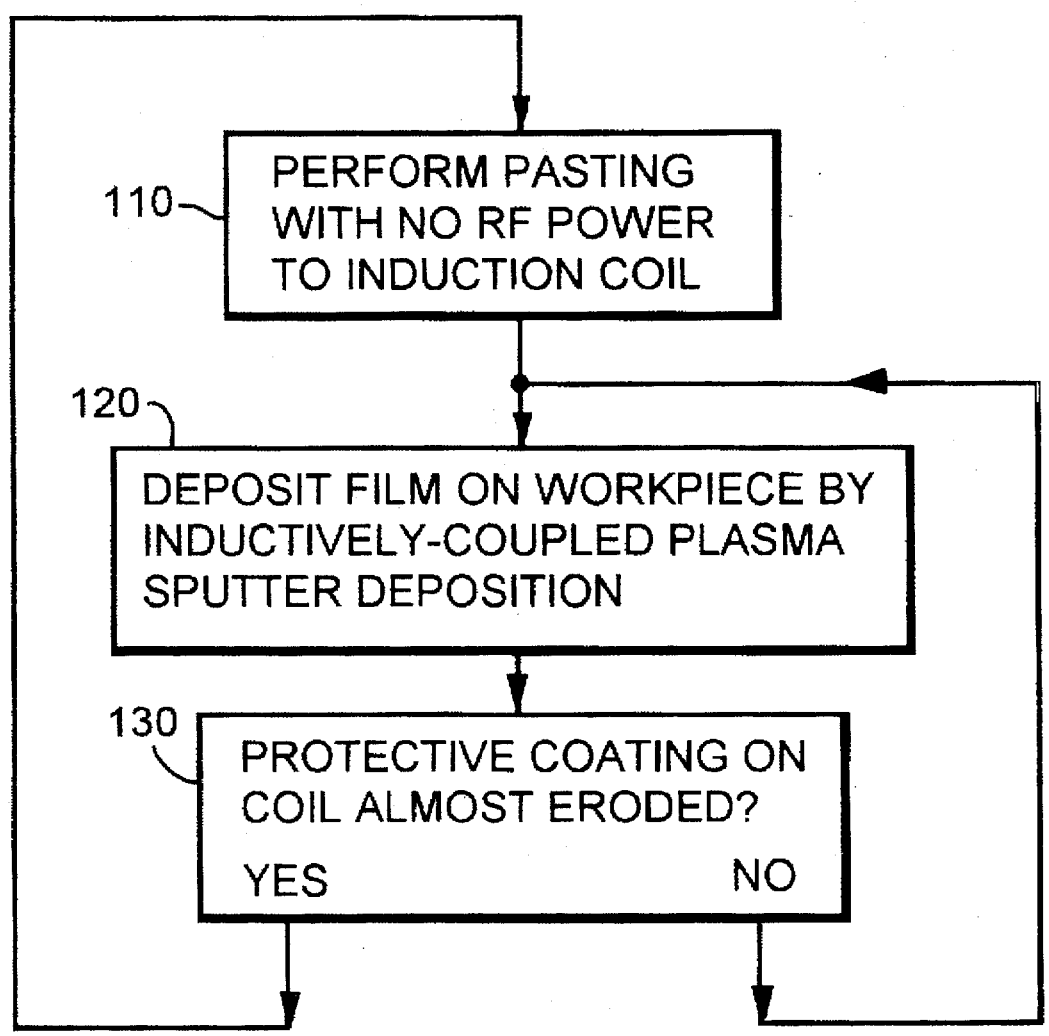
FIG. 2 is a flow chart showing the process steps of the present invention.

Referring to FIG. 2, the complete process of our invention comprises the previously described pasting process and ionized sputter deposition process performed alternately. First, the pasting process is performed to deposit a protective coating of target material on the induction coil (Step 110). Then, the ionized sputter deposition process is performed to deposit a desired film on a series of semiconductor workpieces (Step 120).

The protective coating on the induction coil will become progressively eroded by sputtering during the ionized sputter deposition process. Before the coil coating is eroded to the point where the coil material underlying the coating may be exposed, the ionized sputter deposition process should be suspended, and the pasting process should be repeated (Step 130). This alternation between pasting process and sputter deposition process can continue indefinitely.

The amount of ionized sputter deposition that can be performed until it is necessary to repeat the pasting process depends on many factors, including the relative geometries of the chamber, target and induction coil, and including various process parameters such as electrical power, gas flow rate, and chamber pressure. Therefore, some testing is necessary to determine how long the ionized sputter deposition process should continue before it is interrupted to repeat the pasting process. The test would consist of performing the pasting process, then performing the ionized sputter deposition on a series of semiconductor wafers, and then measuring the contamination levels in the films deposited on successive wafers. The result of the test should be that a first number of wafers measure low contamination, and then subsequent wafers display a rise in contamination. This indicates that the number of wafers processed before repeating the pasting process should be no greater than that first number, and preferably less than that number to provide a margin of safety.

Of course, increasing the duration of the pasting process to increase the thickness of the protective coating deposited on the induction coil will commensurately increase the amount of ionized sputter deposition that can be performed before repeating the pasting process. However, depending on the type of mterial being deposited, an excessively thick protective coating may be undesirble because it may flake off the coil. For example, titanium nitride is likely to flake off if deposited to a thickness greater than roughly 10 to 50 microns. On the other hand, a protective coating of either aluminum or titanium generally will not flake off even if hundreds of microns thick. For any deposited material, it is preferable to roughen the surface of coil before the coil is first installed in a chamber, thereby enhancing adhesion of the subsequently deposited protective coating. Conventional bead blasting is the presently preferred method of roughening the coil surface.

In a semiconductor production environment, the computer which controls operation of the sputtering chamber can be programmed to perform a pasting process after a predetermined number of semiconductor wafers undergo ionized sputter deposition. Alternatively, instead of counting the number of wafers processed, the computer can measure the total time period that RF power is applied to the induction coil, and repeat the pasting process after a predetermined time period.

5. Experimental Results

The present invention was tested with a titanium metal deposition process. First, a titanium pasting process was performed with the following process parameters: 30 mTorr chamber pressure, 50 sccm argon sputtering gas flow rate, and 5 kilowatts of DC electrical power applied to the titanium target. During the pasting process, a dummy (i.e., blank) 8-inch silicon wafer was loaded on the wafer chuck for purposes of protecting the chuck and to permit measuring the sputter deposition rate. The titanium deposition rate on the dummy wafer was 1000 Å/min., i.e., 0.1 micron/min. The pasting process was performed on 10 successive dummy wafers for 2 minutes each. In other words, the pasting was performed for a total period of 20 minutes, during which period 2 microns of titanium film was deposited cumulatively on the wafers. (In actual production, it would be equally effective to deposit 2 microns of Ti on one wafer for 20 minutes instead of depositing Ti on 10 wafers for 2 minutes each.)

After the pasting process, an ionized sputter deposition process was performed on another ten wafers which simulated production wafers. The process parameters for the ionized sputter deposition were the same as for the pasting, except that the induction coil RF power supply 50 and the wafer bias DC power supply 52 were turned on. Specifically, RF power was applied to the induction coil at 2 MHz frequency and 1.5 kilowatts power. The negative DC bias applied to the wafer was −25 volts. Each wafer received a 1 minute deposition of 1000 Å, i.e., 0.1 micron. Analysis of the titanium film deposited on the fifth and tenth wafers revealed that both films had the same low contamination levels which would be present in a non-ionized sputtering system. In other words, the pasting process successfully eliminated any increase in contamination due to sputtering of the induction coil.

In contrast, when the same ionized sputter deposition process was performed without the pasting, using an induction coil fabricated of 99.97% pure commercial grade titanium, contamination levels an order of magnitude higher were observed for iron, nickel, and chromium impurities.

6. Alternative Implementations

Although the described preferred embodiment is a non-reactive sputter deposition process using argon sputtering gas, the invention is equally applicable to a conventional reactive sputter deposition process in which a process gas (such as nitrogen) reacts with the sputtered target material (such as titanium) to form a compound (such as titanium nitride) which is deposited on the workpiece. In fact, as reported by Rossnagel et al., supra, ionized sputter deposition is especially useful for reactive sputter deposition, because the increased energy of the ions bombarding the workpiece can permit maintaining the workpiece at a lower temperature during the deposition process.

When using the invention in a reactive sputter deposition process, an additional option exists in the pasting process, namely, whether to conduct the pasting process in the presence of the reactive process gas (nitrogen, in the preceding example), or whether to turn off the flow of reactive process gas during the pasting process and supply only an inert sputtering gas (such as argon) to the chamber. In the former case, the same compound to be deposited on the semiconductor workpiece (such as titanium nitride) will be deposited on the induction coil. In the latter case, the target material (such as titanium) will be deposited on the induction coil. Either option should accomplish the objective of preventing material sputtered from the induction coil from contaminating the semiconductor workpiece. In the exemplary case of titanium nitride deposition, it would be preferable to perform the pasting process without nitrogen, because titanium will adhere to the induction coil better than titanium nitride.

The electrical power applied to the target can be RF rather than DC, as is well known. For example, an RF-powered target is described in U.S. Pat. No. 5,178,739 issued Jan. 12, 1993 to Barnes et al., the entire content of which hereby is incorporated by reference into this patent specification.

We claim:

1. A method of operating an inductively-coupled plasma sputter deposition chamber for depositing films on semiconductor workpieces, comprising the steps of:
   (a) providing an inductively-coupled plasma sputter deposition chamber having a sputtering target, an induction coil, and a workpiece support chuck having a surface for mounting a semiconductor workpiece;
   (b) depositing a protective coating of target material on a surface of the induction coil, including the sub-steps of
      (i) providing a sputtering gas within the chamber,
      (ii) maintaining a vacuum inside the chamber, and
      (iii) applying electrical power to the target so as to excite the sputtering gas into a plasma state near the target and sputter material from the surface of the target,
      (iv) while not applying RF electrical power to the induction coil;
   (c) subsequently depositing a film on one or more semiconductor workpieces, including the sub-steps of
      (i) mounting one or more semiconductor workpieces on the chuck within the chamber;
      (ii) providing a sputtering gas within the chamber,
      (iii) maintaining a vacuum inside the chamber,
      (iv) applying electrical power to the target so as to excite the sputtering gas into a plasma state near the target and sputter material from the surface of the target, and
      (v) applying RF electrical power to the induction coil.

2. A method according to claim 1, further comprising terminating the step of depositing a film before the surface of the induction coil beneath the protective coating is exposed by sputtering of the coating.

3. A method according to claim 2, further comprising the step of:
   after terminating the step of depositing a film, repeating the steps of depositing a protective coating and subsequently depositing a film.

4. A method according to claim 1, wherein the step of depositing a film further comprises applying a negative DC bias voltage to said one or more workpieces.

5. A method according to claim 1, wherein the step of depositing a protective coating further comprises covering the workpiece mounting surface of the chuck.

6. A method according to claim 5, wherein the step of covering the workpiece mounting surface of the chuck comprises mounting a dummy semiconductor wafer on the chuck.

7. A method according to claim 1, wherein the step of depositing a film further comprises sequentially mounting each one of said workpieces on the chuck and sequentially depositing the film on each workpiece.

8. An inductively-coupled plasma sputter deposition chamber for depositing films on semiconductor workpieces, comprising:
   a vacuum chamber;

a sputtering target mounted within the chamber;

a workpiece support chuck mounted within the chamber, said chuck having a surface for mounting a semiconductor workpiece;

an induction coil mounted within the chamber;

a gas inlet for supplying a sputtering gas to the interior of the chamber;

a first electrical power supply connected to the target, wherein said first power supply provides sufficient electrical power to the target to excite the sputtering gas into a plasma state near the target and sputter material from the surface of the target;

a second electrical power supply connected to the induction coil, said second power supply having an on state during which it supplies radio frequency power to the induction coil and an off state during which it does not supply radio frequency power to the induction coil; and a controller circuit connected to control the first and second power supplies, wherein the controller circuit sequentially operates in a first pasting mode followed by a second deposition mode, wherein during the pasting mode the controller circuit turns off the second power supply and activates the first power supply, whereby a protective coating of target material deposits on a surface of the induction coil, and during the deposition mode the controller circuit turns on the second power supply and activates the first power supply, whereby a film is deposited on any semiconductor workpiece mounted on the chuck.

9. A chamber according to claim 8, wherein the controller circuit terminates the deposition mode of operation before the surface of the induction coil beneath the protective coating is exposed by sputtering of the coating.

10. A chamber according to claim 9, wherein, after terminating the deposition mode, the controller repeats the pasting mode and then the deposition mode.

11. A chamber according to claim 8, further comprising a third electrical power supply for applying a negative DC bias voltage to any workpieces mounted on the chuck.

12. A chamber according to claim 8, further comprising a cover apparatus for covering the workpiece mounting surface of the chuck during the pasting mode of operation.

13. A chamber according to claim 12, wherein the cover apparatus comprises apparatus for mounting a dummy semiconductor wafer on the chuck.

* * * * *